United States Patent
Tominaga et al.

(10) Patent No.: US 6,647,632 B2
(45) Date of Patent: Nov. 18, 2003

(54) POSITION MEASURING APPARATUS

(75) Inventors: Tamotsu Tominaga, Akishima (JP); Satoshi Hirokawa, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/060,321

(22) Filed: Feb. 1, 2002

(65) Prior Publication Data
US 2002/0104231 A1 Aug. 8, 2002

(30) Foreign Application Priority Data
Feb. 5, 2001 (JP) .................................... 2001-028204
Feb. 5, 2001 (JP) .................................... 2001-028205

(51) Int. Cl.$^7$ .............................................. G01B 7/00
(52) U.S. Cl. ........................... 33/1 M; 33/613; 33/645; 414/935; 414/936; 356/3.09
(58) Field of Search ........................ 33/1 M, 613, 645; 414/935, 936, 940; 356/3.09

(56) References Cited

U.S. PATENT DOCUMENTS

| | | | | |
|---|---|---|---|---|
| 4,934,064 A | * | 6/1990 | Yamaguchi et al. | .......... 33/645 |
| 5,189,805 A | * | 3/1993 | Matsumoto et al. | ......... 33/1 M |
| 5,355,744 A | * | 10/1994 | Yanagisawa | ................. 33/1 M |
| 5,408,750 A | * | 4/1995 | Teng et al. | ................... 33/1 M |
| 6,157,157 A | * | 12/2000 | Prentice et al. | .............. 33/1 M |
| 6,324,933 B1 | * | 12/2001 | Waskiewicz et al. | .............. 33/1 M |
| 6,408,526 B1 | * | 6/2002 | Montesanti et al. | ......... 33/1 M |
| 6,434,840 B1 | * | 8/2002 | Jourtchenko et al. | ........ 33/1 M |
| 6,463,664 B1 | * | 10/2002 | Bieg | .......................... 33/1 M |

* cited by examiner

*Primary Examiner*—Diego Gutierrez
*Assistant Examiner*—Amanda J Hoolahan
(74) *Attorney, Agent, or Firm*—Antonelli, Terry, Stout & Kraus, LLP

(57) ABSTRACT

A position measuring apparatus for an alignment of an array of devices such as a thin film magnetic heads on a semiconductor wafer with a high degree of accuracy and satisfactory reproducibility, comprising, on a base, an object holding unit on which an object to be measured, an X-stage, a portal sub-base arranged across over the X-stage, a Y-stage arranged on the portal sub-base, a TV microscope (detector) capable of movement in a Z-axial direction, a ball circulation type linear guide and a motor for driving and guiding the X-stage and the Y-stage, an X-axial straight bar and a Y-axial straight bar attached to side surfaces of the object holding unit, and triangulation type laser displacement meters arranged in the vicinity of and in opposite to the X-axial bar and Y-axial bar, for detecting lateral motion errors during straight movement of the holding unit in the X- and Y-axial direction with a high degree of accuracy.

12 Claims, 7 Drawing Sheets

POSITION MEASURING APPARATUS

BACKGROUND OF THE INVENTION

1. Field of the Invention

The present invention relates to a position measuring apparatus adapted to detect a lateral variation of a stage during straight motion of the stage.

2. Related Art

A plurality of thin film magnetic heads are formed on a semiconductor wafer with the use of a thin film process, and thereafter the heads are cut off from the semiconductor wafer on which the magnetic heads are formed, for being separated from one another. Accordingly, if the accuracy of alignment of the heads formed in a row on the wafer is low, individual shapes and dimensions of magnetic poles become non-uniform (uneven) so that available characteristics of the magnetic heads are non-uniform. Thus, it is required to measure the alignment of an array of heads (which will be hereinbelow referred to "head array") formed on the semi-conductor wafer with a high degree of accuracy.

Heretofore, there has been used an apparatus for measuring an alignment of the above-mentioned head array, in which a semiconductor wafer is mounted and fixed on an X-stage guided by a direct-operated static air bearing, the direction of the head array to be measured on the semiconductor wafer being set to be coincident with the direction of movement of the X-stage, the wafer is moved by the X-stage, pitch by pitch for measurement while the alignment of the head array to be measured are measured by a TV microscope, in order to precisely measure an alignment of the array.

Although this apparatus can precisely measure the alignment of the head array on the basis of a degree of accuracy as to the straight guide of the direct-operated static air bearing, it can hardly avoid affection by vibration of air in the air bearing unit including a ball screw, a linear motor and the like for driving the X-stage, and accordingly, it is difficult to obtain a reproducibility of measurement within 0.02 μm.

Further, there has been used another apparatus in which an X-Y stage 41 carrying thereon a wafer 46 is provided with an orthogonal plain reflector 42 in parallel with the X-axis and Y-axis, respectively, as shown in FIG. 5 of the accompanying drawings, illustrating an exposure apparatus used in the field of semiconductors, and displacements of the X-Y stage 41 in the X- and Y-axial directions are measured by laser interferometers 23, 24 for measuring relative displacements between themselves and the orthogonal plane reflectors 42.

However, in the above-mentioned conventional apparatus, although an alignment of a head array to be measured (that is, electronic devices formed on the wafer 46) is measured on the basis of the orthogonal plane reflector 42, it is required to position the X-Y stage 41 and the orthogonal plane reflector 42 over an entire measuring area in order to measure the alignment of the array over the entire measuring area on the wafer. Accordingly, the distances between the orthogonal plane reflector 42 and the laser interferometers 43, 44 should be set so as to include the above-mentioned entire measuring area in the extent of movement of the X-stage. For example, if the measuring area has 200 mm diameter, the distances between the orthogonal plane reflector 42 and the laser reflectors 43, 44 should be set to be greater than at least 200 mm diameter. In this configuration, if the temperature varies by 0.05 deg. C., thus measured distances vary by 200 mm×0.5 deg. C.×1× $10^{-6}$/deg. C.=1×$10^{-4}$ mm=0.1 μm, and accordingly, it has been raised such a problem that this variation directly causes measuring errors.

Meanwhile, in order to measure an alignment of an array of electronic devices such as the above-mentioned thin film magnetic heads, the measuring errors should be settled within 0.01 μm, and accordingly, a temperature difference should be held within 0.05 deg. C. during measurement. Further, in the above-mentioned conventional measuring apparatus, in addition to the temperature variation, a variation in the atmospheric pressure should be limited to a small value, and further, other mechanical deformation including thermal expansion should be limited to small values. However, it is difficult to economically materialize such an apparatus.

Further, in a process of manufacturing liquid crystal substrates or liquid crystal display elements, it is required to measures dimensions of a precise pattern such as a mask formed on the surface thereof. Heretofore, as to an apparatus for measuring such a precise pattern, there has, in general, been well-known such an apparatus that a substrate to be measured is shifted by an X-Y stage while an image of the precise pattern on the surface thereof is picked up by a TV microscope in order to measure the pattern.

By the way, these years, there has been raised such a demand that display units using the above-mentioned liquid crystal substrate or liquid crystal display elements, are required to be large-sized and highly accurate. In order to satisfy the above-mentioned demands even a two-dimensional liquid display apparatus for measuring dimensions of a precise pattern on the liquid crystal substrate or the liquid crystal display element, is required to high-precisely measure the precise pattern which is formed with a high degree of accuracy on such a large-sized substrate or element. Specifically, a reproducibility (measuring accuracy) of less than 0.1 μm is required over a range of several hundreds to several thousands millimeters (several 100 to several 1,000 mm).

Conventionally, there has been used a two-dimensional measuring apparatus as shown in FIG. 6 of the accompanying drawings. That is, as shown in the figure, an X-stage 2 and a Y-stage 22 provided on a portal frame 21 extending across the X-stage 2 thereover are provided on a base 1, and a Z-stage 27 is assembled to the Y-stage 21 while a TV microscope 29 is mounted on the Z-stage 27. With this arrangement, the TV microscope 29 is positioned above the above-mentioned substrate while the X-stage 2, the Y-stage 22 and the Z-stage 27 are moved. It is noted that displacements of the X-stage 2 and the Y-stage 22 are precisely measured by means of laser interferometers 8a, 8b, 8c and plane reflectors 7a, 7b, 37. Thus, two-dimensional dimensions (in X- and Y-axial directions) of the point to be measured on the above-mentioned object to be measured can be obtained from the position of the point to be measured within the field of vision of the microscope, which is measured by the TV microscope 29 and the image processing device (which is not shown), and from the displacements of the X-stage 2 and the Y-stage 22 which are measured by the laser interferometers 8a, 8b, 8c.

By the way, in the above-mentioned conventional two-dimensional measuring apparatus and the method therefor, reproducible measuring errors during measurement of, for example, dimensions, are added with errors caused by lateral motions of the stage during movement in X- and Y-axial directions. That is, when the stage is moved in, for example, the X-axial direction, lateral or sidewise motions are caused in the Y-axial direction (a direction orthogonal to the advancing direction of the stage) due to affection by yawing, rolling or the like during movement of the stage, and these lateral motions cause the errors. Thus, it is required to maximumly enhance the reproducibility of straightness during movement in X- and Y-axial directions, and accordingly, static air bearings 53a, 53b and 63 and linear drive motors 54, 64 are used in combination for guiding the stage in the X- and Y-axial directions.

However, with the above-mentioned technologies, since the accuracy of reproducible measurements falls in a range from about 0.1 to 0.2 μm, the obtained straight guide reproducibility has become about 0.2 μm. However, as mentioned above, since objects to be measured have become larger and larger, the static air bearings capable of moving the stage over a distance in a range from 100 to 1,000 mm require fabrication with a high degree of accuracy over its large dimensions, and accordingly, become extremely expensive. In addition, the linear drive motors are also expensive, and further, the heat value generated therefrom is high. Thus, excessive measuring errors due to thermal variations are caused in the apparatus which inevitably requires high measuring reproducibility and straight guide reproducibility, and accordingly, it has been unpreferable.

Further, in another two-dimensional measuring apparatus or method therefor, as shown in FIG. 7 of the accompanying drawings, a TV microscope 29 is positioned in the Z-axial direction, and then an X-Y stage 103 (which is not shown in FIG. 7), but which has a structure having an X-stage and a Y-stage superposed with the X-stage) is positioned in the X- and Y-axial directions. It is noted that the X-Y stage 102 is provided with plane reflectors 107a, 107b having reflection surfaces which are parallel with the X- and Y-axes, respectively, outside of an object to be measured, that is, at side surfaces thereof. Thus, displacements of the X-Y stage are measured also by laser interferometers 108a, 108b with a high degree of accuracy.

It is noted that, in this apparatus or method, the crossing point between laser beams emitted to the plane reflectors 107a, 107b from the laser interferometers 108a, 108b is set to be coincident with the optical axis of the TV microscope 29, and is set substantially at the same Z-axial position as that of the surface to be measured (that is, the top surface of the object to be measured). Thus, reproducible lateral motion errors can be measured, in principle, during straight movement in the X- and Y-axial directions by means of the laser interferometers. Specifically, if the X-Y stage 102 is moved in, for example, X-axial direction, a displacement of the plane reflector 107a in parallel with the X-axis is measured by the laser interferometer 108b, a lateral variation during straight motion on the X-axis (that is, a displacement in the Y-axial direction) can be measured.

By the way, with the above-mentioned conventional two-dimensional measuring apparatus or method, a lateral variation during straight motion of the stage with the use of the laser interferometers. However, the following problems have been raised.

That is, the Z-stage 109 is arranged across and over the X-Y positioning stage 102 which is moved in the X- and Y-axial directions, and further, the laser interferometers 108a, 108b are provided to end parts of the X-Y stage 102. With this configuration, the dimensions of a base 110 carrying them inevitably become larger. Accordingly, the gravitational load center of the base involving the weight of the X-Y stage is shifted as the X-Y stage 102 is moved, and accordingly, the base 110 is warped so that the distances and the positional relationship between the laser interferometers 108a, 108b and the plane reflectors 107a, 107b vary, thereby it has been raised such a problem that accurate measurements for displacements of the stage become difficult.

Further, in the above-mentioned configuration, since the distances between the laser interferometers 108a, 108b and the plane reflectors 107a, 107b become larger than the dimensions (for example, several 100 to several 1,000 mm) of an object to be measured, the measurements for displacements of the stages are susceptible to affection by environment including a temperature and an atmospheric pressure, and accordingly, there has been also raised such a problem that measuring errors becomes excessive. That is, if a plane reflector and a laser interferometer are arranged so as to set the distance therebetween to, for example, about 200 mm, when the temperature varies by 0.5 deg. C. so that the refractive index of the air is changed, the measuring distance varies by 200 mm×0.5 deg. C.×$10^{-6}$/deg. C.=1×$10^{-4}$ mm=0.1 μm, and accordingly, it has been raised such a problem that this variation also directly causes measuring errors. Accordingly, the above-mentioned configuration can not always exhibit satisfactory reproducible measuring errors or real guide reproducibility.

That is, as mentioned above, since the dimensions of objects to be measured become greater and greater or the precision of patterns become higher and higher, although measuring reproducibility less than 0.1 μm can be obtained over a range from several 100 to several 1,000 mm, real reproducible lateral motion errors during straight movements of the X-Y stage in the X- and Y-axial directions directly cause measuring errors in the conventional technology. Moreover, since heat generated from the stage drive system becomes higher, the above-mentioned configuration is inappropriate for the above-mentioned highly accurate measuring, and is extremely expensive.

SUMMARY OF THE INVENTION

The present invention is devised in view of the above-mentioned problems inherent to the prior art, and accordingly, a first object of the present invention is to provide a two-dimensional measuring apparatus which can economically exhibit reproducibility of measuring an alignment of an array with accuracy of about 0.01 μm.

Further, a second object of the present invention is to provide a two-dimensional measuring apparatus which can greatly reduce measured reproducible lateral errors during straight movement of an X-Y stage so as to obtain sufficient measuring reproducibility with no use of an expensive drive and guide system, and which is inexpensive, even though the apparatus is large-sized.

To the end, according to a first aspect of the present invention, there is provided a position measuring apparatus for detecting a lateral variation during straight motion of a stage, comprising:

a base;

an object holding unit for holding thereon said object to be measured;

a first stage, on which the object holding unit is placed;

a first axial drive and guide unit for driving and guiding the first stage in a first axial direction;

an image detecting unit provided above the object holding unit, for picking up an image of the object so as to deliver an image signal thereof;

a first detection unit for detecting a lateral variation during straight motion of the first stage in the axial direction, the first detection unit provided in the vicinity of the side surface of the first axial direction of the objet holding unit; and a compensating unit coupled with the first detection unit, for compensating the image signal outputted from the image detection unit on the basis of a signal from the first detection unit.

Further, in a specific form of the first aspect of the present invention, the position measuring apparatus further comprises a second stage provided on the base, across and over the first stage, and adapted to move in a direction orthogonal to a moving direction of the first stage, and the image detecting unit being provided above the second stage.

Further, in a further specific form of the first aspect of the present invention, in the position measuring apparatus first detection unit comprises a plane reflector attached to a first axial side surface of said object holding unit, for reflecting laser light and a laser interferometer provided in the vicinity of and in opposite to said plane reflector.

In addition, in another specific form of the first aspect of the present invention, in the position measuring apparatus, a distance between the laser interferometer and the plane reflector is shorter than the maximum moving distance of the first stage in the first axial direction.

In a further specific form of the first aspect of the present invention, in the position measuring, the distance between the laser interferometer and the plane reflector is set to a value within a range of several mm.

In a further specific form of the first aspect of the present invention, a position measuring further comprises a rotation table provided between said first stage and said object holding unit, for rotating said object to be measured.

In a further specific form of the first aspect of the present invention, in a position measuring apparatus, the first axial drive and guide unit comprises either one of a ball screw and a linear motor.

According to a second aspect of the present invention, there is provided a position measuring apparatus for detecting a lateral variation during straight motion of a stage, comprising;

a base;

an object holding unit for holding thereon an object to be measured;

a first stage, on which the object holding unit is placed, provided above the base, for moving the object holding unit in a first axial direction.

a sub-base arranged on the base and extended in a second axial direction orthogonal to the first axial direction;

a second stage adapted to move on the sub-base in the second direction;

a first and a second axial drive and guide unit for driving and guiding the first and second stages in a first and second axial direction, respectively;

an image detecting unit provided on the second stage, movable in a third axial direction orthogonal to the first stage, for picking up an image of the object to be measured so as to deliver an image signal thereof;

a first detection unit provided in the vicinity of a side surface of the first stage which extends in the first axial direction, for detecting a lateral variation during straight motion of the first stage in the first axial direction;

a second detection unit provided in the vicinity of a side surface of the second-stage which extends in the second axial direction, for detecting a lateral variation during straight motion of the second stage; and a compensating unit coupled with the first and second detection units, for compensating the image signal outputted from the image detection unit on the basis of signals outputted from the first and second detection units.

In a specific form of the second aspect of the present invention, in the position measuring apparatus, a first distance between the first detection unit and the side surface of the first stage which extends in the first axial direction, and a second distance between the second detection unit and the side surface of the first detection unit which extends in the second axial direction are shorter than maximum moving distances of the first and second stages in the first and second axial directions, respectively.

In a further specific form of the second aspect of the present invention, in the position measuring apparatus, the distance between the first detection unit and the side surface of the first stage which extends in the first axial direction and the distance between the second detection unit and the side surface of the first detection unit which extends in the second direction are set to be within a range of several mm.

In a further specific form of the second aspect of the present invention, in the position measuring apparatus, each of the fist and second axial drive and guide units, comprises a motor and a ball circulation type linear guide.

In a further specific form of the second aspect of the present invention, in the position measuring apparatus, each of the first and second detection units comprises either one of a triangulation type laser displacement meter or a laser interferometer.

In a further specific form of the second aspect of the present invention, in a position measuring apparatus, the first and second stages are moved respectively in the first and second axial directions in a range of several 100 mm to 1,000 mm.

The present invention will be detailed in the form of preferred embodiments with reference to the accompanying drawings.

DESCRIPTION OF THE PREFERRED EMBODIMENT

Explanation will be made of a first embodiment of the present invention with reference to FIGS. 1 and 2 of the accompanying drawings.

Figure 1:
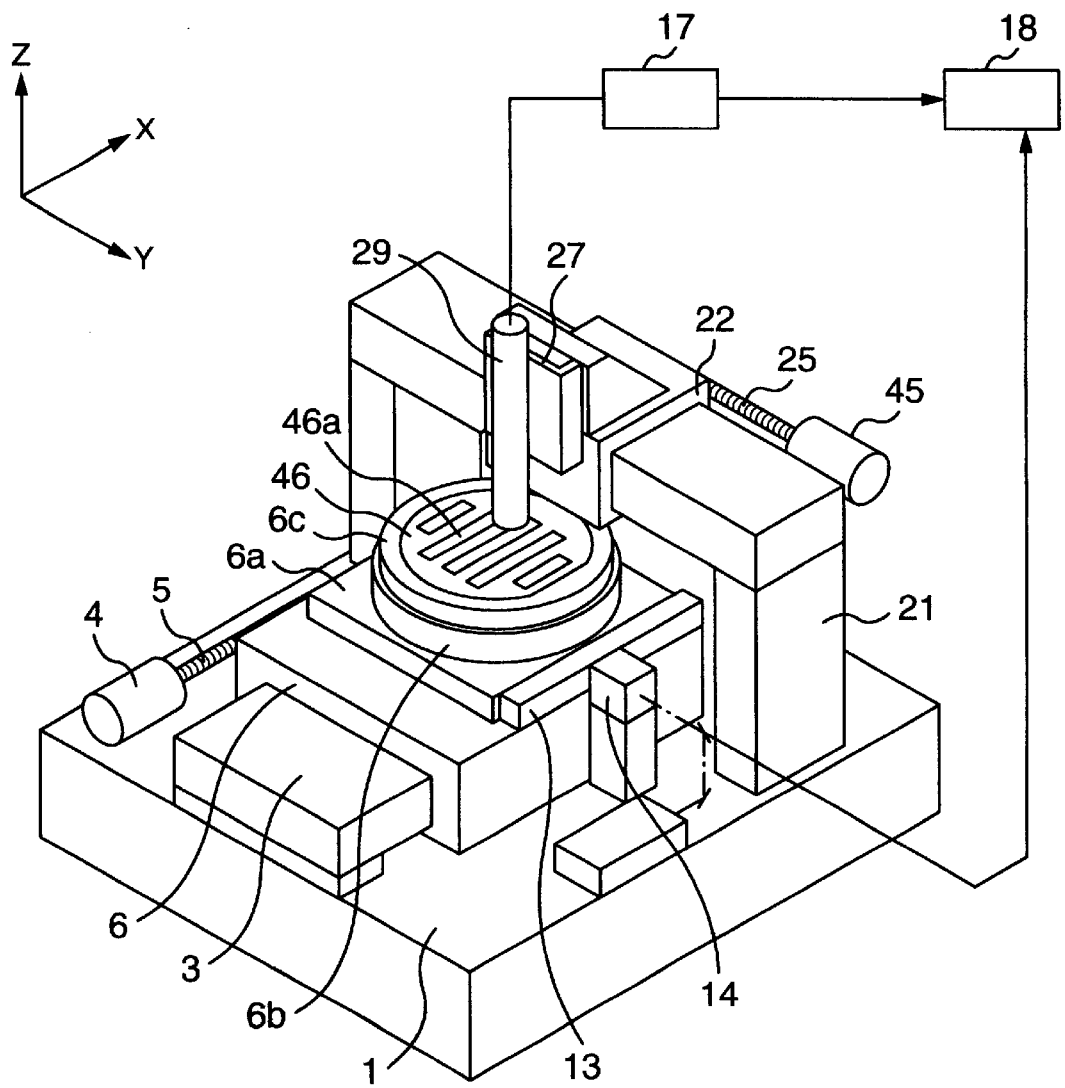
FIG. 1 is a perspective view illustrating a two-dimensional measuring apparatus including a circuit in a first embodiment of the invention.
Figure 2:
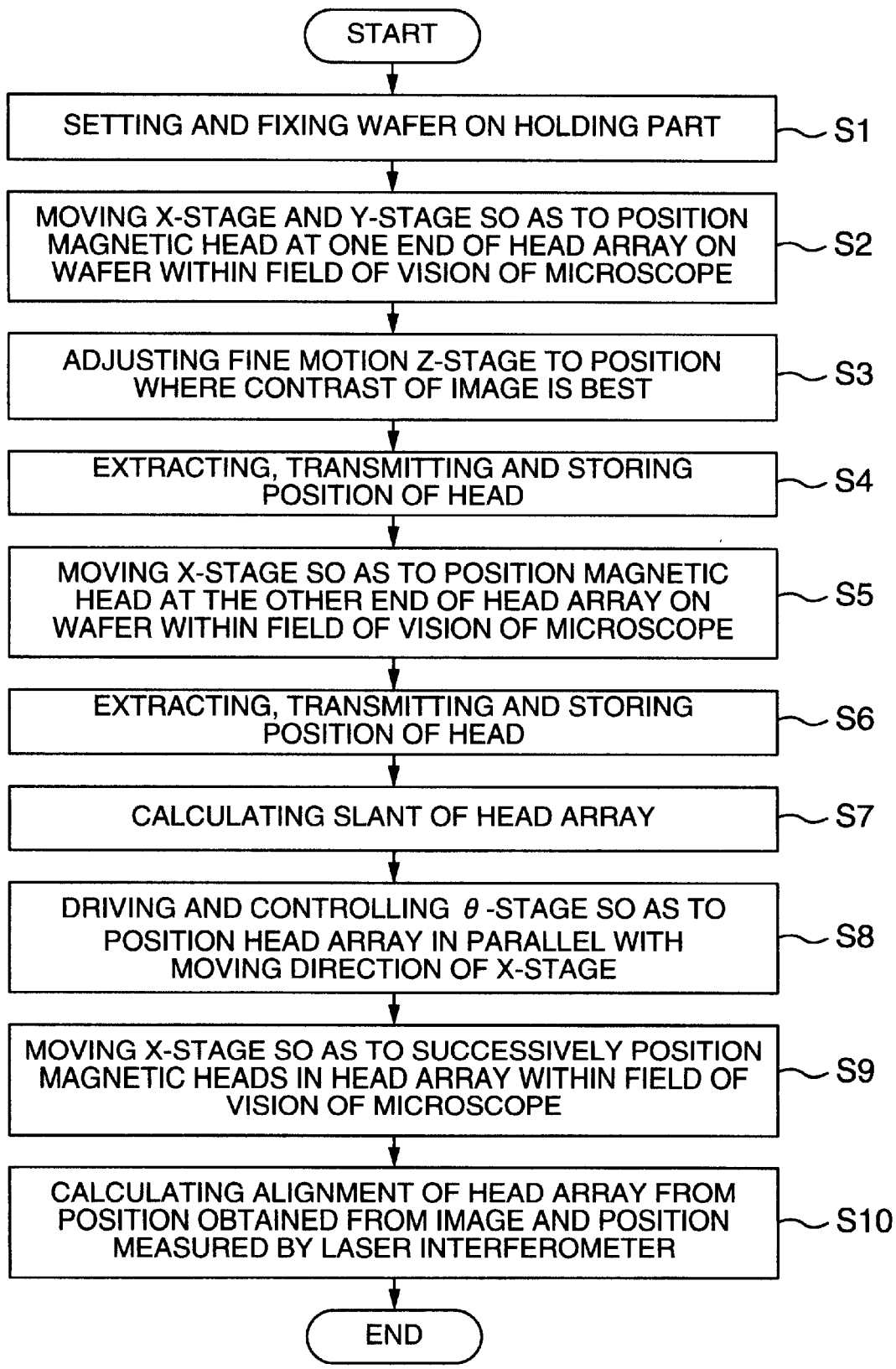
FIG. 2 is a flow-chart for explaining measuring operation of an alignment of an array of heads, in the two-dimensional measuring apparatus shown in FIG. 1.

At first, referring to FIG. 1 which shows a two-dimensional measuring apparatus in the first embodiment of the present invention, specifically in the form of an apparatus for measuring an alignment of an array of electronic devices such as thin film magnetic heads formed on a semiconductor wafer, a rectangular X-stage 6 is set on a base 1, and is guided by a direct acting air bearing 3 and driven in an X-axial direction by a ball screw 5. It is noted that the drive mechanism for the X-stage 6 is composed of the ball screw 5 which is inexpensive, and the electric motor 4 which is relatively small sized and inexpensive and which is coupled to the ball screw 5, and it can automatically drive the X-stage 6 in the X-axial direction. Thus, the apparatus can be fabricated at a relatively low cost. A planar slight-motion Z-stage 6a is provided on the X-stage 6. It is noted that this slight-motion Z-stage 6a is adapted to move a semiconductor wafer 46 as an object to be measured, in the vertical direction (Z-axial direction) to the extent of several 10 μm upon auto-focusing, and is moved in the Z-axial direction by, for example, a piezoelectric element.

This slight motion Z-stage 6a is provided thereon with a disc-like θ-stage 6b on which a wafer holding unit 6c for holding thereon a wafer 46 as an object to be measured is in turn mounted. It is noted that this θ-stage 6b is adapted to be rotated in the X-Y plane as shown in order to allow the direction of an array 46a of the magnetic heads formed on the wafer 46 to be coincident with the moving direction (X-axial direction) of the X-stage.

Further, the slight motion Z-stage 6a is attached thereto at its end surface which is one of surfaces extending in the X-axial direction, on the right side in the figure, with a parallelepiped plane reflector 13 having a reflecting surface parallel with the moving direction of the X-stage 6. Further, as clearly understood from this figure, the a laser interferometer 14 is arranged at a position in the vicinity of and in opposite to the reflecting surface of the plane reflector 13. It is noted that the laser interferometer 14 is attached to the base 1, the distance D to the reflecting surface of the plane reflector 13 therefrom being set to be equal to or less than, for example, 2 mm, that is 2 mm≧D>0. Further, the reflector 13 is laid at the end face of the slight motion Z-stage 6a to such an extent as to correspond to the movement of the X-stage 6.

In a conventional apparatus, a laser interferometer has been arranged so as to emit a beam in a direction the same as the moving direction of a stage in order to precisely measure a displacement of the stage, and accordingly, it has been unable to arrange the later interferometer with a distance between the stage and the interferometer which is shorter than a maximum displacement of the stage. However, the laser interferometer according to the present invention is the one which measures a lateral variation during straight motion of the X stage 6, and accordingly, it can be arranged in a direction orthogonal to the moving direction of the stage, that is, in a direction in which the laser beam is emitted. Accordingly, the distance between the laser interferometer and the stage can be shorter than the maximum displacement of the stage. In particular, it is preferable to arrange the interferometer, near to the stage as possible as it can if a high degree of measuring accuracy is required.

In the above-mentioned embodiment, a portal (U-like) sub-base 21 is fixed to the base 1, extending across and over the X-stage 6, and a Y-stage 22 is provided on the sub-base 21 so as to be movable in a Y-axial direction orthogonal to the X-axial direction (in the moving direction of the X-sage 6). It is noted that the Y-stage 22 can be moved by a drive and guide mechanism including a ball screw 24 in the Y-axial direction as shown in the figure. It is noted that this drive and guide mechanism is composed of the ball screw which is inexpensive, and an electric motor which is small-sized and relatively inexpensive and which is coupled to the ball screw. With this arrangement, the Y-stage 22 can be driven and guided in the Y-axial direction. Thus, the apparatus can be fabricated at a low cost. It is noted that the X-stage 6 and the Y-stage 22 can be moved, independent from each other, as clearly understood from the above-mentioned configuration.

This Y-stage 22 is provided thereon with a rough motion Z-stage 27 to which a TV microscope 29 is in turn mounted. It is noted that an image signal obtained from the TV microscope 29 is delivered to an image processing device 14 as shown in the figure, and is then delivered to, for example, a computer device 18. As clearly understood from the figure, positional data of the plane reflector 13 which are measured by the laser interferometer 14 is inputted to the computer device 18.

Next, explanation will be made of the operation of the array alignment measuring apparatus with reference to FIG. 2 which shows a flow-chart.

At first, a semiconductor wafer 46, as an object to be measured, which is formed on its surface with several magnetic heads, is set and fixed on the wafer holding unit 6c in the apparatus by a robot arm or the like which is not shown (step S1).

Then, the X-stage 6 and the Y-stage 22 are driven by action of a control unit which is not shown, in response to an instruction from the computer device 18. Thereby, a magnetic head at one end of the magnetic head array 46a formed on the wafer 46 is located within the field of vision of the TV microscope 29 (step S2). Thereafter, a contrast of an image obtained by the TV microscope 29 is extracted by the image processing unit 17, and the wafer 46 is moved by operating the fine-motion Z-stage 6a in the vertical direction (Z-axial direction) so as to cause the contrast of the image to become fully satisfactory in order to obtain a sharp image (step S3). Thus, the image processing unit 17 picks up a position of the magnetic head in the field of vision of the TV microscope 29, and the picked up position is transmitted to the computer device 18 in order to store the position in memory (step S4).

Next, the X-stage 6 is driven so as to position a magnetic head at the other end of the head array 46a formed on the wafer 46 within the field of vision of the TV microscope 29 (step S5), and then, through steps similar to those as mentioned above, the position of the magnetic head is picked up and is then transmitted to the computer device 18 for storing the position in memory (step S6). Thus, the computer device 18 computes a slant of the magnetic head array 46a with respect to the moving direction of the X-stage (the X-axial direction), from the positions of both ends (that is, one end and the other end) of the magnetic head array 46a formed on the wafer 46 (step S7). Then, in accordance with the result of the computation, the computer device 18 delivers an instruction to the control unit which is not shown so as to control and drive the θ-stage 6b in the apparatus, and accordingly, the head array 46a on the wafer 46 is positioned so as to be parallel with the moving direction (X-axial direction) of the X-stage. (step 8).

Then, the X-stage 6 is driven so as to allow magnetic heads in the magnetic head array 46a to come into the field of vision of the TV microscope 29, one by one (step S9). At this time, a condition (alignment) of the array of the magnetic heads is computed by the computer device 18 with respect to the plane reflector 13 as a reference, from the position of the plane reflector 13 measured by the laser interferometer 14 and the position of the magnetic head measured by the TV microscope 29 and the image processing unit 17 (step S10).

That is, with the above-mentioned configuration, detrimental affection caused when the X-stage 6 being driven in the X-axial direction, that is, affection upon the straightness of the guide by the drive and guide mechanism 4 including the ball screw and the linear motor, for driving the X-stage 6, or affection by vibration of the air in the direct acting air bearing 2, is measured in the form of a positional variation of the plane reflector 13 measured by the laser interferometer 14. Further, the measured positional variation is added to or subtracted from the position of the magnetic head measured by the TV microscope 29 and the image processing unit 17 so as to measure an alignment of the array of the magnetic heads with extremely enhanced accuracy in reference to the plane reflector 13.

At this stage, since the laser interferometer 14 and the plane reflector 13 the position of which is measured by the laser interferometer 14, are arranged in the vicinity of and in opposite to each other, as mentioned above, and specifically, the distance therebetween is set to be equal to or less than 2 mm. Thus, measuring errors caused by a variation in refractive index of the atmospheric air therebetween due to a temperature variation can be reduced to a small value. That is, if the temperature variation is 0.5 deg. C., the measuring errors become 2 mm×0.5 deg. C.×$10^{-6}$ mm. deg. C.=$1\times10^{-4}$ mm=0.001 $\mu$m. That is, this value becomes one tenth of 0.01 $\mu$m which is a desired measuring error. Thus, the measuring accuracy is satisfactory.

As mentioned above, with the array alignment measuring apparatus according to the present invention, the stage positioning mechanism is composed of the X-axial stage mechanism and the Y-axial stage mechanism which are independent from each other. Further, with the provision of such a configuration that the degree of the X-axial straightness with which the object to be measured is positioned is measured by the plane reflector laid in parallel with the moving direction of the X-stage and the laser interferometer positioned in proximity with the reflector, the measurement can be made with an extremely high degree of accuracy. It is noted that a TV microscope emitting an illumination beam having a short wavelength in a range from, for example, 200 to 400 nm is preferably used as the TV microscope 29 for picking up an image of each of the magnetic heads in the head array 46a on the wafer 6 as an object to be measured, in order to enhance the resolution thereof, thereby it is possible to obtain high dimensional reproducibility. Further, it is preferable to arrange the Y-stage and the Z-stage, symmetric in the Y-axial direction with respect to the TV microscope as a center in order to restrain thermal deformation.

It is noted, in the above-mentioned embodiment, although detailed explanation has been made of the measurement of an alignment of the head array of magnetic heads on the wafer as an object to be measured, the present invention should not be limited to this measurement. That is, it goes without saying that the present invention can be effectively applied to another configuration which requires measurement of a degree of straightness with a high degree of accuracy. Further, in the above-mentioned embodiment, a static capacitive sensor may be used, instead of the laser interferometer for measuring the position of the plane reflector which is moved together with the X-stage. Further, although it has explained that the plane reflector is attached to the side surface of the fine-motion Z-stage 6a, the attachment thereof may be made at any position in such a unit which is moved in parallel with the X-stage. For example, it may be attached to a side surface of the X-stage.

In addition, in the above-mentioned embodiment, in order to measure the alignment of an array of magnetic heads arranged in a plurality of rows with a high degree of accuracy (that is, in order to enable the TV microscope to move in the Y-axial direction), the portal (or U-like shape) sub-base is fixed to the base, across and over the X-stage, and the Y-stage is mounted to this portal sub-base. However, it goes without saying that no such a Y-stage is required in a configuration in which the alignment (straightness) of an array in an object to be measured is measured with a high degree of accuracy while the X-stage is moved alone.

Figure 3:
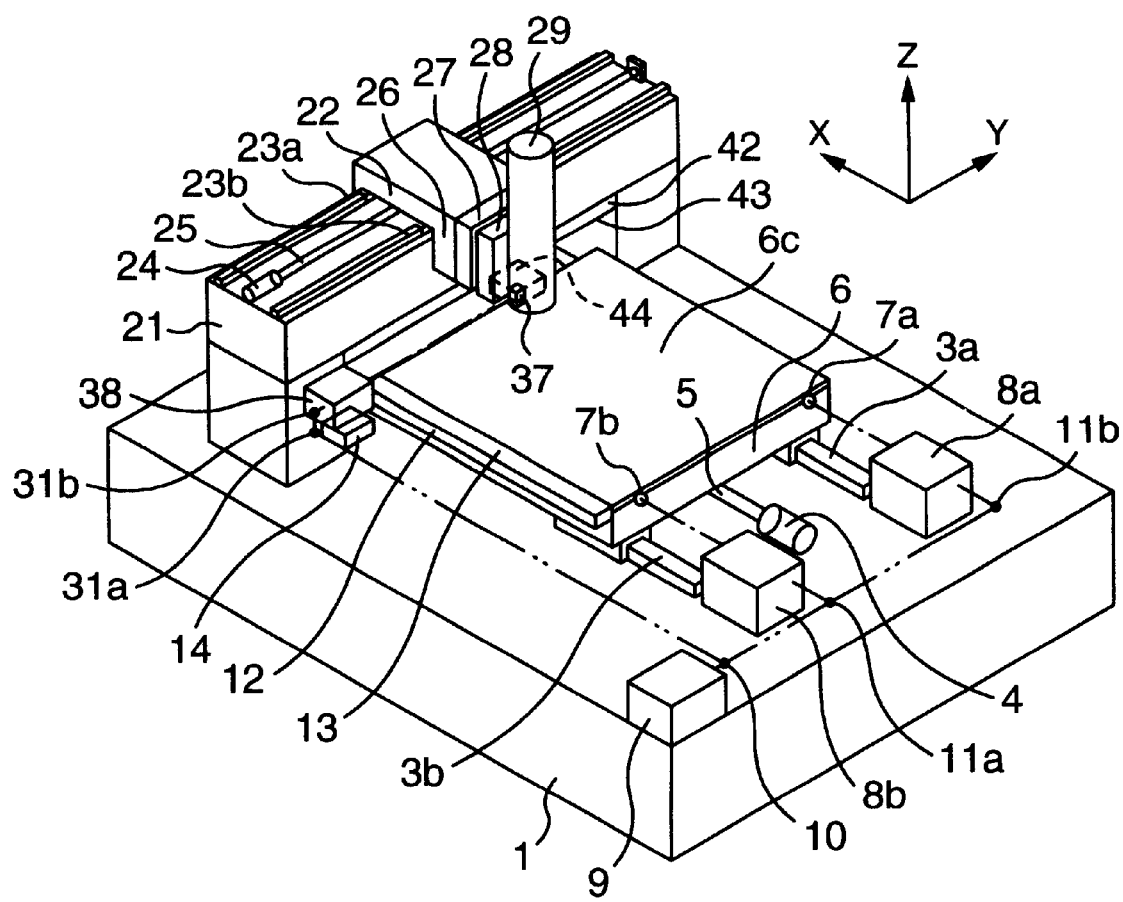
FIG. 3 is a perspective view illustrating a two-dimensional measuring apparatus in a second embodiment of the present invention.

Next, a second embodiment of the present invention will be detailed with reference to FIGS. 3 and 4 which show a two-dimensional measuring apparatus. Referring first to FIG. 3 which is a perspective view illustrating a two-dimensional measuring apparatus in the second embodiment of the present invention, there are shown a base 1 for this apparatus and an X-stage 6. Further, a portal (U-like) sub-base 21 is provided on the base 1, extending across and over the X-stage 1, and is carried thereon with a Y-stage 22. Meanwhile, the portal sub-base 21 is provided thereto with ball circulating type linear guides 23a, 23b, a Y-axial motor 24 and the like, and accordingly, the Y-stage 22 is moved in the Y-axial direction, being guided by these ball circulation type linear guides 23a, 23b and driven by a ball screw 25 coupled to the Y-axial motor 24. It is noted that this Y-stage 22 is provided so as to be movable in a direction orthogonal to the moving direction of the X-stage 22.

This portal sub-base 21 is further attached thereto with a Z-stage base 26 on which a Z-stage 27 is provided so as to be movable in a direction orthogonal to both X-axis and Y-axis. Further, a detector attaching table 28 is arranged on the Z-stage 27, and a TV microscope 29 serving as a detector for detecting a surface of an object to be measured, is attached to the detector attaching table 28.

Further, this base 1 is provided thereto with ball circulation type linear guides 3a, 3b, an X-axial motor 4 and a ball screw 5 coupled to the X-axial motor. With this arrangement, the above-mentioned X-stage 6 is driven in the X-axial direction by means of the ball screw 5 coupled to the X-axial motor 4, being guided by the ball circulation type linear guides 3a, 3b. That is, in this embodiment, as mentioned above, mechanisms which are available at relatively low costs, such as electric motors and ball circulation type linear guides can be used, instead of static air bearings and linear motors which are extremely expensive if the apparatus becomes large-sized.

Meanwhile, an object holding unit 6c having an upper surface serving as an object holding surface is attached to the upper surface of the X-stage 2. That is, a liquid crystal substrate or a liquid crystal element as an object to be measured, is mounted and fixed on the upper surface of the object holding unit 6c. Further, as shown in the figure, circular reflectors 7a, 7b are attached to a Y-axial direction end face (side surface) of the object holding unit 6c at the same height as that of the surface of the object to be measured, and X-axial laser interferometers 8a, 8b and a laser tube (laser oscillator) 9 are attached on the base 1 at positions opposing the reflectors 7a, 7b. A laser beam emitted from the laser tube 9 is led into the X-axial laser interferometers 8a, 8b by way of a beam splitter 10, and mirrors 11a, 11b (including half mirrors). Then, laser beams are incident upon the reflectors 7a, 7b, after passing through the X-axial interferometers 8a, 8b, and reflected thereupon. Thereafter, the laser beams are again incident upon the X-axial laser interferometers 8a, 8b for measuring a displacement of the X-stage 2 in the X-axial direction with the use of interference of the laser beams.

In addition, an X-axial straight bar 13 which is an oblong reflector having a flat surface 12 parallel with the X-axis is attached to the X-axial direction end face (side surface) of the object holding unit 6 at a position having a height substantially equal to a surface of the object to be measured. Further, for example, a triangulation type laser displacement meter 14 is provided in the vicinity of the X-axial straight bar 13, being opposed to the latter, and accordingly, a displacement of the flat surface 12 in parallel with the X-axis, that is, a displacement of the X-stage 2 in the Y-axial direction can be measured. That is, with this arrangement, a straight error, that is, a displacement (variation) of the X-stage in the Y-axial direction during movement of the X-stage in the X-axial direction can be measured with a high degree of accuracy. With this arrangement, the lateral variation possibly caused in such a case that the X-stage 6 is moved in the X-axial direction, and in particular, a displacement (variation) in the Y-axial direction during X-axial straight motion of the X stage can be precisely measured with the use of a drive and guide mechanism which is relatively inexpensive.

Further, a circular reflector 37 is attached to the TV microscope 29 which is mounted on the Z-stage and which is a detector, at a position near the surface of the objecdt to be measured while an Y-axial laser interferometer 38 is mounted on the base 1 at a position opposed to the reflector 37 and having such a height that the laser beam can be emitted and received by the laser interferometer 38 in parallel with the Y-axis. Specifically, this Y-axial laser interferometer 38 is located above the triangulation type laser displacement meter 14. With this arrangement, the laser beam is emitted from the laser tube 9 and is then split by the beam splitter 10, and it is then incident upon the Y-axial laser interferometer 38 by way of reflectors 31a, 31b. Thereafter, the laser incident upon the Y-axial laser interferometer 38 is incident upon the reflector 37 which therefore reflects back the laser beam to the Y-axial laser interferometer 38 for measuring a displacement in the Y-axial direction with the uses of interference between the laser beams. Strictly speaking, the X-stage 2 does not move in the Y-axial direction, but since the TV microscope 29 is moved in the Y-axial direction by the Z-stage 27 supported by the portal sub-base 21, a relative displace of the X-stage 2 in the Y-axial direction is measured.

Further, a Y-axial straight bar 43 which is an oblong reflector having a flat surface 42 parallel with the Y-axis is laid along the lower surface of the portal sub-base 21 at a heightwise position near to the surface of the object to be measured. Meanwhile, the laser displacement meter 44 (triangulation type) is provided as shown by the broken line, being opposed to the surface 42 parallel with the Y-axis in the vicinity of the latter. With this arrangement, a displacement of the surface 42 parallel with the Y-axis, or the Y-stage 22 (more specifically, a displacement between the surface 42 parallel with the Y-axis and the detector mounting table 28) in the X-axial direction can be measured. That is, with this arrangement, a lateral variation of the Y-stage 22 in the Y-axial direction can be measured with a high degree of accuracy while the Y-stage 22 is moved in the Y-axial direction even though the Y-stage 11 is driven by a drive and guide mechanism (specifically composed of the ball circulation type leaner guides 23a, 23B, the Y-axial motor and the like) which is relatively inexpensive.

It is noted that movement in the X- and Y-axial directions is made by driving the X-axial motor 4 and the Y-axial motor 24 in response to instructions delivered from a control device which is not shown. Accordingly, the object holding unit 6 on which a liquid crystal substrate or a liquid crystal display element as an object to be measured is mounted and fixed, and the Z-stage 26 are moved in order to position a part to be measured (such as a precise pattern on the substrate) of the object to be measured within the visual field of the TV microscope 29.

Next, the above-mentioned detector mounting table 28 is positioned in the Z-axial direction under an instruction from a focus control device which is also not shown. The displacement in the Z-axial direction is about several 100 $\mu$m caused by unevenness in the thickness of a glass substrate as an object to be measured or a warp thereof. This table 28 is formed of a fine-motion Z-stage with an elastic guide, having an about 0.01 $\mu$m of reproducible accuracy for straight guide, as disclosed in Japanese Patent Application No. H10-186211 (Japanese Laid-Open Patent No. 2000-19415).

Figure 4:
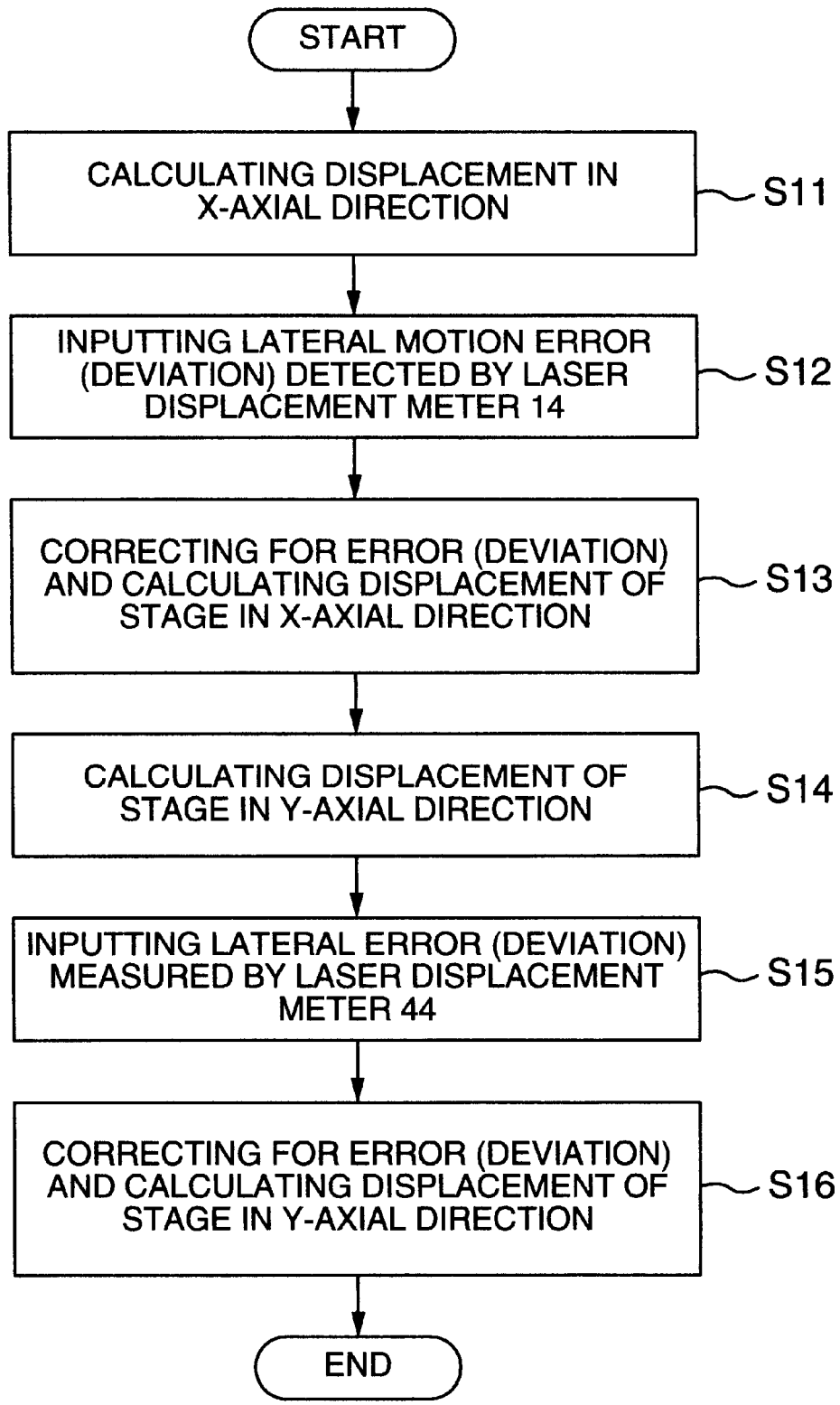
FIG. 4 is a flow-chart for explaining the operation of measuring a displacement (dimensions) by the two-dimensional measuring apparatus shown in FIG. 3.
Figure 5:
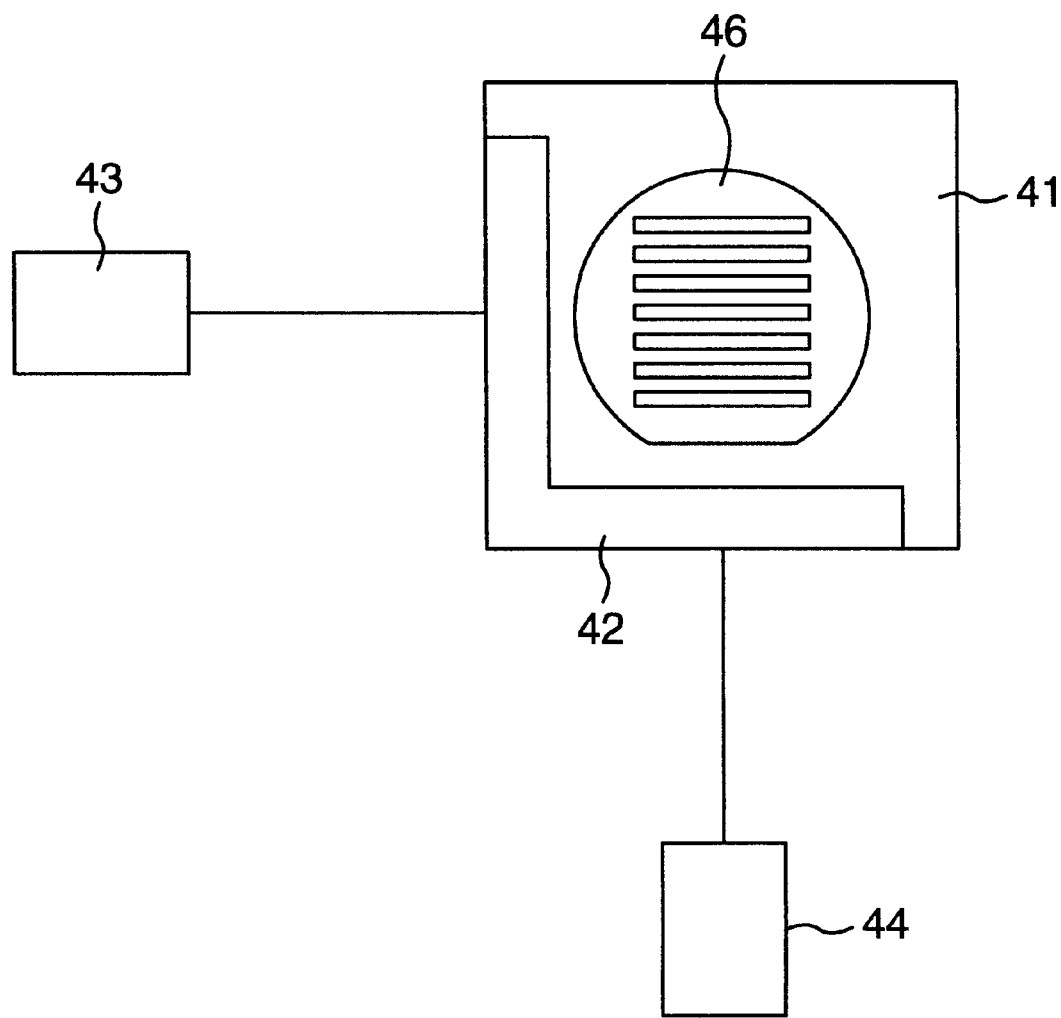
FIG. 5 is a view illustrating an example of a conventional two-dimensional measuring apparatus.
Figure 6:
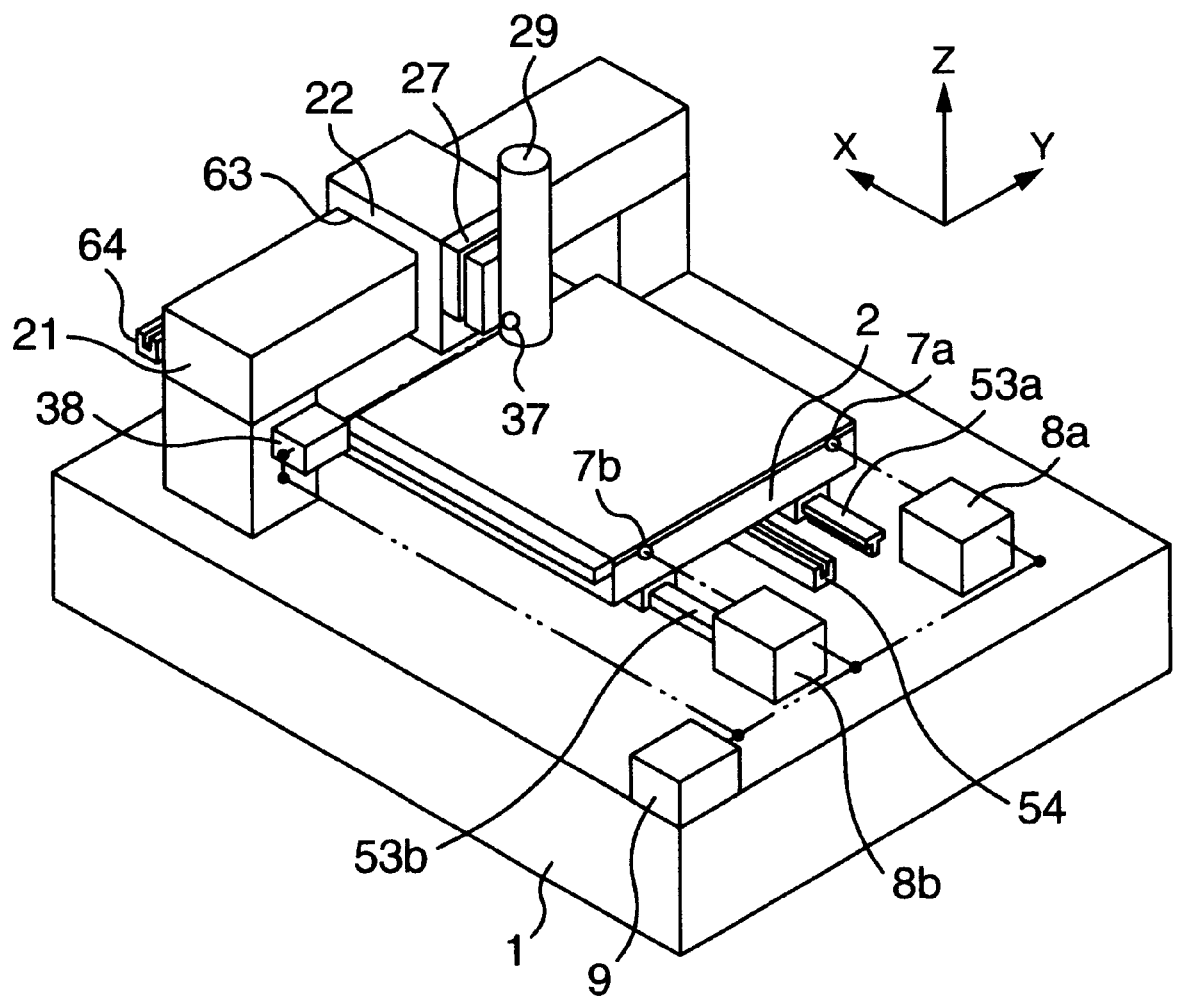
FIG. 6 is a view illustrating another example of a conventional two-dimensional measuring apparatus.

Thus, an image which is obtained in a focusing condition after positioning in the field of vision of the TV microscope 29 is processed by an image processing device and a computer which are not shown, and a position of a point to be measured, dimensions of a fine pattern and the like within the image are calculated. Further, at this time, the measurements for a displacement (dimensions) of the above-mentioned stage during movement in the X- and Y-axial directions are made as follows:

As understood from the flow-chart shown in FIG. 4, a displacement of the TV microscope 29 in the X-axial direction (measurements for dimensions) at that position on the Y-axis, is calculated by the computer from a displacement of the stage in the X-axial direction, detected by the above-mentioned laser interferometers 8a, 8b, (for example, a distance between two points on the X-axis) and a position on the Y-axis, detected by the laser interferometer 38 (step S11). At this time, deviation of about several $\mu$m in the Y-axial direction (errors in straightness) is caused, due to yawing and rolling as the stage is moved in the X-axial direction. However, the lateral motion errors in the Y-axial direction are detected by the above-mentioned laser displacement meter 14, and accordingly, thus, these detected errors (deviations) are transmitted to the computer (step S12). Thus, the computer corrects for these errors (deviations), and computes the displacement of the X-stage in the X-axial direction (step S13).

Next, the displacement (measurements for dimensions) in the Y-axial direction is calculated by the computer as a displacement in the Y-axial direction detected by the Y-axial laser interferometer 38 (step S14). At this time, about several $\mu$m of deviation in the X-axial direction (lateral motion errors during Y-axial straight motion of the Y stage) is caused due to yawing and rolling as the stage is moved in the Y-axial direction. However, the lateral motion errors in the X-axial direction are detected by the laser displacement meter 44, and accordingly, the detected errors (deviation) are transmitted to the computer (Step 15). Accordingly, the computer corrects for the above-mentioned errors (deviation), and computes the displacement of the stage in the Y-axial direction (step S16).

It is noted that the laser displacement meters used in the above-mentioned measuring apparatus in this embodiment are of triangulation type, having less than 0.05 μm of reproducible measuring accuracy in a thermal chamber in which variation in temperature is less than 0.1 deg. C. Accordingly, on the basis of the displacements in the X- and Y-axial directions, calculated as mentioned above, and the positions of measuring points in the field of vision of the TV microscope, calculated previously, dimensions of a precise pattern formed on the above-mentioned substrate as an object to be measured can be measured within 0.1 μm of reproducible accuracy by the computer.

Figure 7:
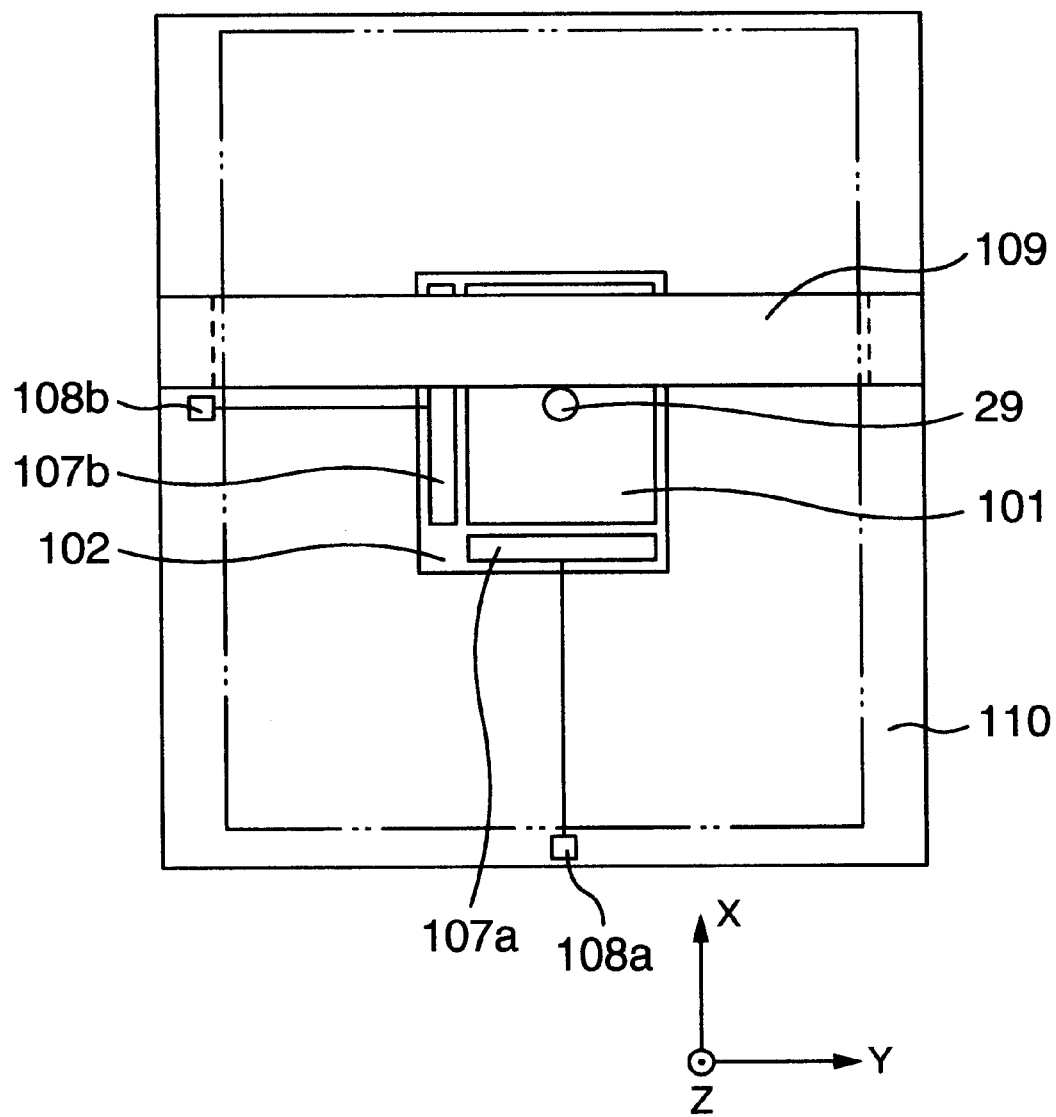
FIG. 7 is a top view illustrating an example of an apparatus used as an exposure apparatus in the semiconductor field.

Further, in the measuring apparatus in the above-mentioned embodiment, the distance between the laser displacement meter 14 and the X-axial straight bar 13, and the distance between the laser displacement meter 44 and the Y-axial straight bar 43, which are arranged in the vicinity of and in opposite to each other, are 8 mm. This distance is less than 1/100 or 1/1,000 with expectable estimation, in comparison with the distance between the laser interferometer 108a and the plane reflector 107a, and the distance between the laser interferometer 108b and the plane reflector 107b (about 1,200 mm) in the above-mentioned conventional measuring apparatus shown in FIG. 7, and accordingly, affection upon error in measured distance caused by temperature variation can be decreased to be less than 1/10. It is noted that the above-mentioned distance can be suitably set to any value within a range from several mm to several 10 mm without being limited to 8 mm, depending upon obtained error tolerance. In particular, it can be set within a range of several mm if a high degree of measuring accuracy is required.

As mentioned above, with the configuration of the two-dimensional measuring apparatus in the above-mentioned embodiments, correction can be made for reproducible lateral motion errors in straightness, which are caused when the X-Y stage in the apparatus is moved straightforward, with a high degree of accuracy. Accordingly, two-dimensional measurements (in the X-axial and Y-axial directions) can be made with a high degree of accuracy even though ball circulation type linear guides and motors which are inexpensive, without using expensive drive and guide systems such as static air bearings as explained in the prior art description.

Although the explanation has been made as to the two-dimensional measuring apparatus in the above-mentioned embodiment so that the triangulation type laser displacement meters are used for measuring or detecting and then calculating lateral motion errors during straight motion of the stages in the X- and Y-axial directions, the present invention should not be limited to this configuration, but other displacement meters such as small-sized laser interferometers which are used for measuring displacements of the stage in the X- and Y-axial directions or capacitive type displacement meters, capable of carrying out comparative measurements with a high degree of accuracy may be used, instead thereof.

As clearly understood from the explanation as mentioned above, the two-dimensional measuring apparatus according to the present invention can be fabricated with a relatively low cost while a condition of an array in an object to be measured can be measured with a high degree of accuracy. In particular, the reproducible measurements for an alignment of an array, which is about 0.01 μm, in particular, about 0.001 μm can be economically materialized. Thus, it can be said that the present invention can exhibit remarkable and excellent technical effects and advantages.

Further, according to the present invention, satisfactory measuring reproducibility can be obtained while lateral motion errors during movement of the X-Y stage can be greatly reduced with no use of expensive drive guide systems, and further, it is possible to exhibit such remarkable technical effect and advantages that a two-dimensional measuring apparatus which can be constituted even in a large size can be provided.

What is claimed is:

1. A position measuring apparatus for detecting a lateral variation during straight motion of a stage, comprising:
    a base;
    an object holding unit for holding thereon said object to be measured;
    a first stage, on which said object holding unit is placed;
    a first axial drive and guide unit for driving and guiding said first stage in a first axial direction;
    an image detecting unit provided above said object holding unit, for picking up an image of said object so as to deliver an image signal thereof;
    a first detection unit for detecting a lateral variation during straight motion of said first stage in said axial direction, said first detection unit provided in the vicinity of the side surface of said first axial direction of said object holding unit; and
    a compensating unit coupled with said first detection unit, for compensating said image signal outputted from said image detection unit on the basis of a signal from said first detection unit,
    wherein said first detection unit comprises:
        a plane reflector attached to a first axial side surface of said object holding unit, for reflecting laser light and a laser interferometer provided in the vicinity of and in opposite to said plane reflector.

2. A position measuring apparatus according to claim 1, further comprising:
    a second stage provided on said base, across and over said first stage, and adapted to move in a direction orthogonal to a moving direction of said first stage, and
    wherein said image detecting unit is provided above said second stage.

3. A position measuring apparatus according to claim 1, wherein a distance between said laser interferometer and said plane reflector is shorter than the maximum moving distance of said first stage in said first axial direction.

4. A position measuring apparatus according to claim 3, wherein said distance between said laser interferometer and said plane reflector is set to a value within a range of several mm.

5. A position measuring apparatus according to claim 3, further comprising a rotation table provided between said first stage and said object holding unit, for rotating said object to be measured.

6. A position measuring apparatus according to claim 1, wherein said first axial drive and guide unit comprises either one of a ball screw and a linear motor.

7. A position measuring apparatus for detecting a lateral variation during straight motion of a stage, comprising;
    a base;
    an object holding unit for holding thereon an object to be measured;
    a first stage, on which said object holding unit is placed, provided above said base, for moving said object holding unit in a first axial direction;
    a sub-base arranged on said base and extended in a second axial direction orthogonal to said first axial direction;
    a second stage adapted to move on said sub-base in said second direction;

a first and a second axial drive and guide unit for driving and guiding said first and second stages in a first and second axial direction, respectively;

an image detecting unit provided on said second stage, movable in a third axial direction orthogonal to said first stage, for picking up an image of said object to be measured so as to deliver an image signal thereof;

a first detection unit provided in the vicinity of a side surface of said first stage which extends in the first axial direction, for detecting a lateral variation during straight motion of said first stage in said first axial direction;

a second detection unit provided in the vicinity of a side surface of said second-stage which extends in the second axial direction, for detecting a lateral variation during straight motion of said second stage; and a compensating unit coupled with said first and second detection units, for compensating said image signal outputted from said image detection unit on the basis of signals outputted from the first and second detection units.

8. A position measuring apparatus according to claim 7, wherein a first distance between said first detection unit and the side surface of said first stage which extends in the first axial direction, and a second distance between said second detection unit and the side surface of said first detection unit which extends in the second axial direction are shorter than maximum moving distances of the first and second stages in said first and second axial directions, respectively.

9. A position measuring apparatus according to claim 8, wherein the distance between said first detection unit and the side surface of said first stage which extends in the first axial direction and the distance between said second detection unit and the side surface of said first detection unit which extends in the second direction are set to be within a range of several mm.

10. A position measuring apparatus as set forth in claim 7, wherein each of said fist and second axial drive and guide units, comprises a motor and a ball circulation type linear guide.

11. A position measuring apparatus as set forth in claim 7, wherein each of said first and second detection units comprises either one of a triangulation type laser displacement meter or a laser interferometer.

12. A position measuring apparatus as set forth in claim 7, wherein said first and second stages are moved respectively in said first and second axial directions in a range of several 100 mm to 1,000 mm.

* * * * *